United States Patent [19]

Kimura

[11] Patent Number: 5,396,659

[45] Date of Patent: Mar. 7, 1995

[54] DIRECT-COUPLED FET FREQUENCY MULTIPLIER AND MIXER CIRCUIT

[75] Inventor: Katsuji Kimura, Tokyo, Japan

[73] Assignee: NEC Corporation, Tokyo, Japan

[21] Appl. No.: 969,331

[22] Filed: Oct. 30, 1992

[30] Foreign Application Priority Data

Oct. 30, 1991 [JP] Japan ................. 3-311840

[51] Int. Cl.$^6$ ............................... H04B 1/28
[52] U.S. Cl. .............................. 455/333; 455/319;
327/113; 327/119
[58] Field of Search .................. 307/529, 254, 255;
332/168; 455/333, 313, 318, 319, 323, 325, 216

[56] References Cited

U.S. PATENT DOCUMENTS

| 4,912,520 | 3/1990 | Yamamoto et al. | 455/333 |
| 5,166,645 | 11/1992 | Watts | 455/333 X |
| 5,276,368 | 1/1994 | Kimura | 307/529 X |

OTHER PUBLICATIONS

A. Nedungadi et al., "Design of Linear CMOS Transconductance Elements", *IEEE Trans. Circuits and Systems*, vol. CAS–31, No. 10, Oct. 1984.

*Primary Examiner*—Edward F. Urban
*Assistant Examiner*—Philip J. Sobutka
*Attorney, Agent, or Firm*—Burns, Doane, Swecker & Mathis

[57] ABSTRACT

A frequency multiplier and mixer circuit comprises a frequency multiplier circuit composed of a first differential amplifier, which includes a first differential circuit formed of source-coupled first and second FETs having their sources connected in common to a first constant current source and a second differential circuit formed of source-coupled third and fourth FETs having their sources connected in common to a second constant current source. The first and second differential circuits constitute two identical unbalanced source-coupled pairs having the same gate width/length ratio K, input terminals of the pairs being connected in cross-coupled fashion, the output terminals of the pairs being connected in parallel. Gates of the first and third FETs are connected in common to one terminal of a first pair of input terminals for receiving a signal to be frequency-multiplied, and gates of the second and fourth FETs are connected in common to the other terminal of the first pair of input terminals. A current mirror circuit network has an input current path connected to the first output node so as to flow a differential current between the first and second output nodes. A second differential amplifier, which constitutes a mixing circuit, includes a pair of emitter-coupled bipolar transistors having their bases connected to receive a mixing signal. Emitters of the pair of bipolar transistors are connected in common to a mirror current path of the current mirror circuit network. A collector of one of the bipolar transistors gives an output signal.

5 Claims, 2 Drawing Sheets

DIRECT-COUPLED FET FREQUENCY MULTIPLIER AND MIXER CIRCUIT

BACKGROUND OF THE INVENTION

1. Field of the Invention

The present invention relates to a frequency multiplier and mixer circuit forming one circuit capable of executing both a frequency multiplying operation and a mixing operation.

2. Description of Related Art

As is well known, in the case of requiring both of the frequency multiplying operation and the mixing operation, for example, a frequency multiplying circuit and a mixing circuit, which are independent of each other, have been coupled with a bandpass filter.

However, with this prior art frequency multiplying and mixing circuit it has been difficult to achieve a wide operating band. In addition, if the frequency multiplying circuit and the mixing circuit are implemented in a bipolar and MOS semiconductor integrated circuit process, since terminals are required to externally connect the filter, the number of external terminals in the semiconductor integrated circuit has to be increased.

SUMMARY OF THE INVENTION

Accordingly, it is an object of the present invention to provide a frequency multiplier and mixer circuit which overcomes the above mentioned defects of the conventional art.

Another object of the present invention is to provide a frequency multiplier and mixer circuit, which requires no external filter and which can be realized in a semiconductor integrated circuit without increasing the number of external terminals.

The above and other objects of the present invention are achieved in accordance with the present invention by a frequency multiplier and mixer circuit comprising:

a first pair of input terminals for receiving a signal to be frequency-multiplied;

a second pair of input terminals for receiving a mixing signal;

an output terminal for outputting an output signal;

a frequency multiplier circuit composed of a first differential amplifier, which includes a first differential circuit formed of source-coupled first and second field effect transistors having their respective driving powers in a ratio of K:1 where K is a positive real number excluding 1, and a second differential circuit formed of source-coupled third and fourth field effect transistors having their respective driving powers in a ratio of 1:K, sources of the first and second field effect transistors being connected in common to a first constant current source, and sources of the third and fourth field effect transistors being connected in common to a second constant current source, gates of the first and third field effect transistors having different driving powers being connected in common to one terminal of the first pair of input terminals, and gates of the second and fourth field effect transistors having different driving powers being connected in common to the other terminal of the first pair of input terminals, drains of the first and fourth field effect transistors having the same driving power being connected to one node of a pair of output nodes, and drains of the second and third field effect transistors having the same driving power being connected to the other node of the pair of output nodes;

a current mirror means having an input current path connected to the one node of the pair of output nodes so as to flow a differential current between the pair of output nodes, and a mirror current path; and a mixing circuit composed of a second differential amplifier, which includes a pair of inputs connected to the second pair of input terminals, one end of one main current path of two main current paths of the second differential amplifier being connected to the output terminal, the other end of each of the two main current paths being connected in common to the mirror current path of the current mirror means.

Here, in the case of metal-oxide-semiconductor field effect transistors, the driving power can be expressed by a ratio of a gate width "W" to a gate length "L", namely, "W/L". Alteratively, in the case of junction field effect transistors, the driving power can be expressed by a maximum drain current.

In one embodiment, the frequency multiplier and mixer circuit further includes a first current mirror circuit having an input current path and a mirror current path which are respectively connected between a supply voltage and the one node of the pair of output nodes and between the supply voltage and the other node of the pair of output nodes, and wherein the current mirror means includes a second current mirror circuit having an input current path connected between the supply voltage and the one node of the pair of output nodes and a mirror current path connected at its one end to the supply voltage, and a third current mirror circuit having an input current path connected in series with the mirror current path of the second current mirror circuit, a mirror current path of the third current mirror circuit being connected to the other end of each of the two main current paths of the second differential amplifier.

In one preferred embodiment, the second differential amplifier includes a pair of emitter-coupled bipolar transistors having their respective bases connected to the second pair of input terminals, respectively, emitters of the pair of bipolar transistors being connected in series to the mirror current path of the third current mirror circuit, and a collector of one of the bipolar transistors is connected to the output terminal.

In another preferred embodiment, the third current mirror circuit having first and second mirror current paths of the same current capacity. The second differential amplifier includes a first differential circuit formed of source-coupled fifth and sixth field effect transistors having their sources connected in common to the first mirror current path of the third current mirror circuit, and a second differential circuit formed of source-coupled seventh and eighth field effect transistors having their sources connected in common to the second mirror current path of the third current mirror circuit, a ratio of a gate width-to-length ratio of the fifth field effect transistor to a gate width-to-length ratio of the sixth field effect transistor being 1:9.5, and a ratio of a gate width-to-length ratio of the seventh field effect transistor to a gate width-to-length ratio of the eighth field effect transistor being 9.5:1, gates of the fifth and eighth field effect transistors being connected in common to one input of the second pair of input terminals, and gates of the sixth and seventh field effect transistors being connected in common to the other input of the second pair of input terminals, drains of the fifth and seventh field effect transistors being connected to each other, and drains of the sixth and eighth field effect transistors being connected to each other.

Preferably, the first and second constant current sources have the same current capacity, and the driving power of the first and fourth field effect transistors is larger than that of the second and third field effect transistors.

The above and other objects, features and advantages of the present invention will be apparent from the following description of preferred embodiments of the invention with reference to the accompanying drawings.

DESCRIPTION OF THE PREFERRED EMBODIMENTS

Figure 1:
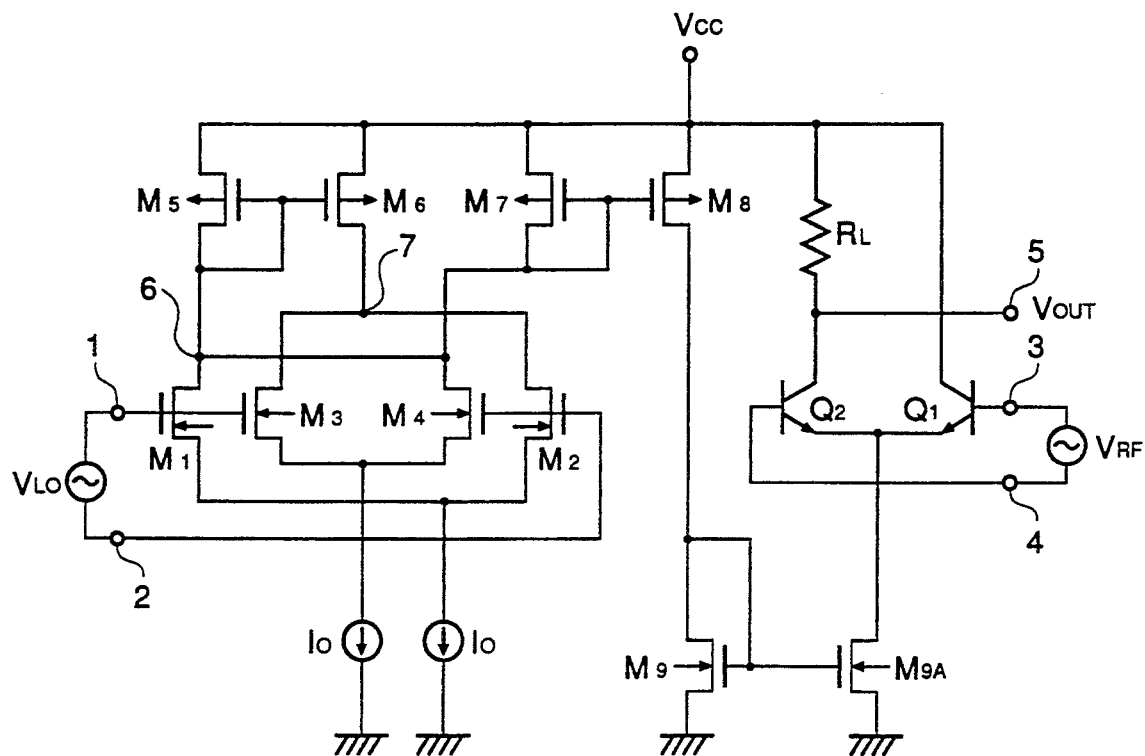
FIG. 1 is a circuit diagram of a first embodiment of the frequency multiplier and mixer circuit in accordance with the present invention.

Referring to FIG. 1, there is shown a circuit diagram of a first embodiment of the frequency multiplier and mixer circuit in accordance with the present invention.

The shown frequency multiplier and mixer circuit includes a first differential amplifier composed of field effect transistors (FETs). The first differential amplifier includes two sets of differential transistor pairs, a first differential transistor pair being formed of source-coupled FETs M1 and M2 having their sources connected through a current source Io to ground, and a second differential transistor pair being formed of source-coupled FETs M3 and M4 having their sources connected through another current source Io to ground.

The two sets of differential transistor pairs are configured to have the following driving power ratio:

M1:M2=M4:M3=K:1 where K is a positive real number excluding 1.

A pair of FETs M1 and M4, which have the same driving power but which are connected to the different current sources, respectively, have their drains connected to each other so as to constitute one node 6 of a pair of output nodes. Another pair of FETs M2 and M3, which have the same driving power but which are connected to the different current sources, respectively, have their drains connected to each other so as to constitute the other node 7 of the pair of output nodes.

In addition, a pair of FETs M1 and M3, which have the different driving powers, respectively, and which are connected to the different current sources, respectively, have their gates connected to each other and connected in common to one terminal 1 of a first pair of input terminals for receiving a local voltage signal $V_{LO}$ to be frequency-multiplied. Another of FETs M2 and M4, which have the different driving powers, respectively, and which are connected to the different current sources, respectively, have their gates connected to each other and connected in common to the other terminal 2 of the first pair of input terminals.

The shown frequency multiplier and mixer circuit also includes a second differential amplifier composed of a pair of emitter-coupled bipolar transistors Q1 and Q2. Bases of these bipolar transistors Q1 and Q2 are respectively connected to a second pair of input terminals 3 and 4 for receiving a mixing voltage signal $V_{RF}$. In addition, a collector of the transistor Q1 is connected to a supply voltage Vcc, and a collector of the transistor Q2 is connected through a load resistor $R_L$ to the supply voltage Vcc. The collector of the transistor Q2 is also connected to an output terminal 5 for outputting a mixer output voltage signal $V_{OUT}$.

Furthermore, the shown frequency multiplier and mixer circuit includes three current mirror circuits. The first current mirror circuit is composed of FETs M5 and M6 having their gates connected to each other and having their sources connected in common to the supply voltage Vcc. A drain of the FET M5 is connected to the gate of the FET M5 itself and also to the one output node 6 which is connected in common to the drains of the FETs M1 and M4. A drain of the FET M6 is connected to the other output node 7 which is connected in common to the drains of the FETs M2 and M3. Therefore, the FET M5 constitutes an input current path of the first current mirror circuit, and the FET M6 constitutes a mirror current path of the first current mirror circuit.

The second current mirror circuit is composed of FETs M7 and M8 having their gates connected to each other and having their sources connected in common to the supply voltage Vcc. A drain of the FET M7 is connected to the gate of the FET M7 itself and also to the one output node 6 which is connected in common to the drains of the FETs M1 and M4. The FET M7 constitutes an input current path of the second current mirror circuit, and the FET M8 constitutes a mirror current path of the second current mirror circuit.

The third current mirror circuit is composed of FETs M9 and M9A having their gates connected to each other and having their sources connected in common to the ground. A drain of the FET M9 is connected to the gate of the FET M9 itself and also to a drain of the FET M8 of the second current mirror circuit. A drain of the FET M9A is connected to the emitters of the transistors Q1 and Q2 of the second differential amplifier. The FET M9 constitutes an input current path of the third current mirror circuit, and the FET M9A constitutes a mirror current path of the third current mirror circuit.

Thus, a differential current between the two sets of differential transistor pairs in the first differential amplifier flows through the FET M7, and therefore, a corresponding differential current also flows through the FET M8, so as to control an emitter current of the second differential amplifier.

Here, it would be apparent to persons skilled in the art that, in the above mentioned embodiment, the respective FETs can be replaced by bipolar transistors.

In the case that the first differential amplifier is constituted of metal-oxide-semiconductor field effect transistors (MOSPETs), the driving power can be expressed by a ratio of a gate width "W" to a gate length "L", namely, "W/L". Therefore, if the FETs M1 to M4 have their gate width-to-length ratios of "$W_1/L_1$", "$W_2/L_2$", "$W_3/L_3$", and "$W_4/L_4$", the following relation holds:

$W_1/L_1 = K(W_2/L_2) = K(W_3/L_3) = W_4/L_4$ (for example, $L_1=L_2=L_3=L_4$)

Here, if an effective mobility is expressed by $\mu_n$, and a gate oxide film capacitance per unit area is expressed by $C_{ox}$, the transconductance parameter $\beta$ can be expressed by $(\frac{1}{2})\mu_n \cdot C_{ox}(W/L)$. Therefore, if the threshold voltage is expressed by $V_t$ and a gate-source voltage is expressed by $V_{GSi}(i=1, 2, 3, 4)$, a drain current $I_{di}$ of the respective FETs M1 to M4 can be expressed by the following equations (1) to (4):

$$I_{d1} = K\beta(V_{GS1} - V_t)^2 \tag{1}$$

$$I_{d2} = \beta(V_{GS2} - V_t)^2 \tag{2}$$

$$I_{d3} = \beta(V_{GS3} - V_t)^2 \tag{3}$$

$$I_{d4} = K\beta(V_{GS4} - V_t)^2 \tag{4}$$

In addition, the constant current source Io has the constant current expressed by the following equation (5), and the input voltage $V_{LO}$ can be expressed by the following equation (6).

$$I_{d1} + I_{d2} = I_{d3} + I_{d4} = I_o \tag{5}$$

$$V_{GS1} - V_{GS2} = V_{GS3} - V_{GS4} = V_{LO} \tag{6}$$

Therefore, a differential current $\Delta I_1$ between the drain currents $I_{d1}$ and $I_{d2}$ can be expressed by the following equation (7), and a differential current $\Delta I_2$ between the drain currents $I_{d3}$ and $I_{d4}$ can be expressed by the following equation (8). Accordingly, a whole total differential current $\Delta I$ can be obtained in the following equation (9).

$$\Delta I_1 = I_{d1} - I_{d2} \tag{7}$$
$$= \frac{-(1-K)\{(1+K)I_0 - 2K\beta V_{LO}^2\}}{(1+K)^2} +$$
$$\frac{4\beta K V_{LO}\sqrt{(1+K)\frac{I_0}{\beta} - KV_{LO}^2}}{(1+K)^2}$$

$$\Delta I_2 = I_{d3} - I_{d4} \tag{8}$$
$$= \frac{(1-K)\{(1+K)I_0 - 2K\beta V_{LO}^2\}}{(1+K)^2} +$$
$$\frac{4\beta K V_{LO}\sqrt{(1+K)\frac{I_0}{\beta} - KV_{LO}^2}}{(1+K)^2}$$

$$\Delta I = (I_{d1} + I_{d4}) - (I_{d2} + I_{d3}) \tag{9}$$
$$= \Delta I_1 - \Delta I_2$$
$$= \frac{-2(1-K)\{(1+K)I_0 - 2K\beta V_{LO}^2\}}{(1+K)^2}$$

The total differential current $\Delta I$ is brought into a drain current $I_{d8}$ of the FET M8 by cooperation of the first current mirror circuit composed of the FET M5 and M6 and the second current mirror circuit composed of the FET M7 and M8, and therefore, is also brought into respective drain currents $I_{d9}$ and $I_{d9A}$ of the FETs M9 and M9A of the third current mirror circuit. Namely, $\Delta I = I_{d8} = I_{d9} = I_{d9A}$. This third current mirror circuit composed of the FETs M9 and M9A constitutes a driving current source for driving the second differential amplifier formed of the bipolar transistor Q1 and Q2.

Assuming that the transistors Q1 and Q2 have the same DC common-base current gain factor $\alpha_F$, respective collector currents Ic1 and Ic2 of the transistors Q1 and Q2 can be expressed by the following equations (10) and (11):

$$I_{C1} = \frac{\alpha_F \cdot \Delta I}{1 + \exp\left(-\frac{V_{RF}}{V_T}\right)} \tag{10}$$

$$I_{C2} = \frac{\alpha_F \cdot \Delta I}{1 + \exp\left(\frac{V_{RF}}{V_T}\right)} \tag{11}$$

In addition, a sum and a difference between the two collector currents are respectively expressed by following equations (12) and (13):

$$I_{C1} + I_{C2} = \alpha_F \Delta I \tag{12}$$

$$I_{C1} - I_{C2} = \alpha_F \Delta I \tanh\left(\frac{V_{RF}}{2V_T}\right) \tag{13}$$

In the equation (13), the thermal voltage $V_T$ is expressed by $$V_T = (kT/q)$$

where k is Boltzsmann's constant;

q is elementary charge (electric charge of unit electron); and

T is absolute temperature (in the degree of Kelvin scale).

Here, tanh x can be expressed as $\tanh x = x - (\frac{1}{3})x^3 \ldots$, if $|x| << 1$. Therefore, when $|V_{RF}| << 2V_T$, if it can be approximated as $\tanh x \approx x$, the equation (11) can be modified into the following equation (14):

$$I_{C2} = \frac{1}{2}\alpha_F \Delta I \left\{1 - \tanh\left(\frac{V_{RF}}{2V_T}\right)\right\} \tag{14}$$
$$\approx \frac{1}{2}\alpha_F \Delta I \left(1 - \frac{V_{RF}}{2V_T}\right)$$

Therefore, the mixer output voltage $V_{OUT}$ can be expressed by the following equation (15):

$$V_{OUT} = V_{CC} - R_L I_{C2} \tag{15}$$
$$\approx V_{CC} - \frac{1}{2}\alpha_F \Delta I \cdot R_L + \frac{1}{4V_T}\alpha_F \Delta I \cdot V_{RF}$$
$$= V_{CC} + \frac{(1-K)}{1+K}\alpha_F I_0 \cdot R_L - \frac{2(1-K)}{(1+K)^2}\alpha_F \beta R_L \cdot V_{LO}^2$$
$$- \frac{1}{2V_T}\frac{(1-K)}{(1+K)}\alpha_F I_0 \cdot V_{RF}$$
$$+ \frac{1}{V_T}\frac{2(1-K)}{(1+K)^2}\alpha_F \beta R_L \cdot V_{LO}^2 \cdot V_{RF}$$

Here, assuming that $V_{LO} = |V_{LO}| \cos 2\pi f_{LO}t$ and $V_{RF} = |V_{RF}| \cos 2\pi f_{RF}t$, the item of $V^2_{LO} \cdot V_{RF}$ in the equation (15) can be expressed as the following equation (16):

$$V^2_{LO} \cdot V_{RF} \tag{16}$$
$$= |V_{LO}|^2 |V_{RF}| \frac{1 - \cos 2\pi(2f_{LO})t}{2} \cos 2\pi f_{RF}t$$
$$= \frac{1}{2}|V_{LO}|^2 |V_{RF}| \left\{\cos 2\pi f_{RF}t - \frac{1}{2}\cos 2\pi(2f_{LO} + f_{RF})t\right.$$

-continued $$-\frac{1}{2}\cos 2\pi(2f_{LO}-f_{RF})t\Big\}$$

In other words, from the item of $V^2_{LO} \cdot V_{RF}$ in the equation (15) it is possible to obtain a sum frequency component and a difference frequency component between a doubled frequency $2f_{LO}$ of the local signal $V_{LO}$ and the frequency $f_{RF}$ of the mixing signal $V_{RF}$. Therefore, by selecting a desired frequency component from the sum frequency component and the difference frequency component by a filter, it is possible to obtain an output of the frequency multiplier and mixer circuit.

In the above mentioned embodiment, the first differential amplifier has been formed of the MOSFETs. However, the first differential amplifier can be formed of junction type FETs (JFET). In the case of JFETs, since the driving power is defined by a maximum drain current $I_{DSS}$, the above mentioned equations (1), (2) and (5) can be replaced with the following equations (17), (18) and (19), respectively.

$$I_{d1} = KI_{DSS}\left(1 - \frac{V_{GS1}}{V_P}\right)^2 \quad (17)$$

$$I_{d2} = I_{DSS}\left(1 - \frac{V_{GS2}}{V_P}\right)^2 \quad (18)$$

$$I_{d1} + I_{d2} = I_o \quad (19)$$

Namely, a result similar to that of the above mentioned embodiment can be obtained only by replacing $V_T$ and $\beta$ by $V_P$ and $(I_{DSS}/V_P^2)$, respectively. This means that the present invention can be similarly applied to the case in which the FETs are implemented in the GaAs MESFET technology.

In particular, as seen from the above mentioned equation (9), undesired frequency components of the output current of the frequency multiplier circuit is as small as $-40$ dB in comparison with a $2f_{LO}$ component in an actual circuit. Namely, the undesired frequency components is at a level which does not require a filter for removing the undesired components. Therefore, it is expected that the frequency multiplier and mixer circuit can be implemented in a semiconductor integrated circuit chip with requiring no external filter between the frequency multiplier and the mixer.

In the above mentioned embodiment, the second differential amplifier has been formed of the bipolar transistors, but can be formed of FETs. For example, a MOSFET differential amplifier, which can be used as the second differential amplifier, is disclosed by A Nedungadi and T. R. Viswanathan "Design of Linear CMOS Transconductance Elements", IEEE Trans. Circuits and Systems, Vol. CAS-31, No. 10, October, 1984. The differential amplifier disclosed by A Nedungadi and T. R. Viswanathan has an improved linearity of the transconductance by using a cross-coupled quad cell as a squaring circuit, but needs a large number of transistors and therefore requires a large consumption current. In addition, a large occupying area is required in an integrated circuit.

Figure 2:
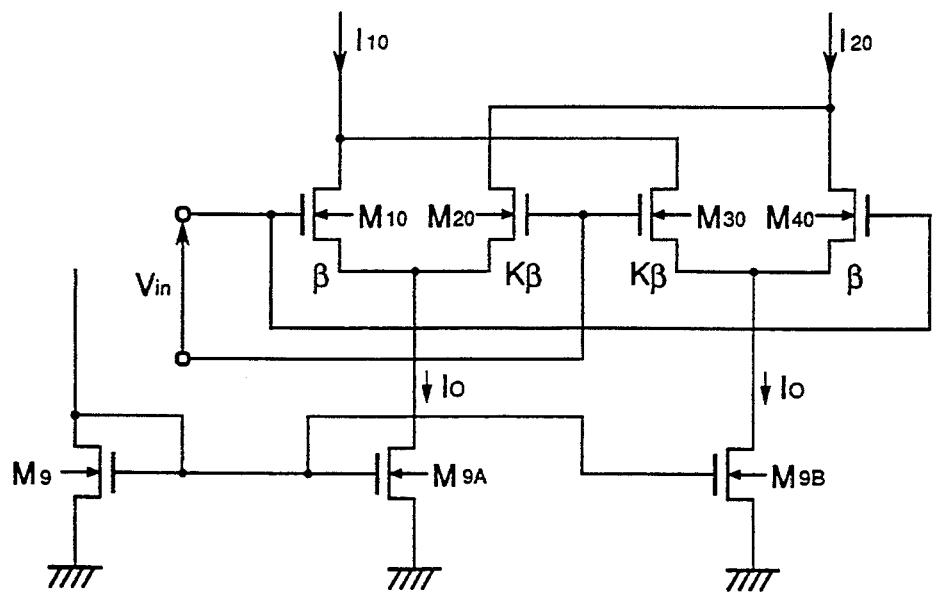
FIG. 2 is a circuit diagram of a differential circuit of the mixer circuit portion of a second embodiment of the frequency multiplier and mixer circuit in accordance with the present invention.

Referring to FIG. 2, there is shown a circuit diagram of a differential circuit which is formed of only FETs and which can be used as the second differential amplifier of the frequency multiplier and mixer circuit in accordance with the present invention. The shown differential amplifier is remarkably simpler in construction than the differential amplifier disclosed by A Nedungadi and T. R. Viswanathan.

The differential amplifier shown in FIG. 2 is composed of two sets of differential transistor pairs, a first differential transistor pair being formed of source-coupled FETs M10 and M20 having their sources connected to ground through the FET M9A (first mirror current path) of the third current mirror circuit acting as a current source Io, and a second differential transistor pair being formed of source-coupled FETs M30 and M40 having their sources connected to ground through a FET M9B (second mirror current path), which is connected to the FET M9A of the third current mirror circuit, similarly to the FET M9A, and which acts as another current source Io.

Here, as mentioned hereinbefore, a ratio of a gate width "W" to a gate length "L" is expressed by "W/L", and the gate width-to-length ratio of the FET M10 to M40 are expressed by "$W_{10}/L_{10}$", "$W_{20}/L_{20}$", "$W_{30}/L_{30}$", and "$W_{40}/L_{40}$", respectively. In connection with the gate width-to-length ratio, the FET M10 to M40 has the following relation:

$(W_{10}/L_{10}):(W_{20}/L_{20})=1:K$ $(W_{30}/L_{30}):(W_{40}/L_{40})=K:1$ where K is 9.5.

Gates of the FETs M10 and M40 are connected to each other and also connected in commo to one of a pair of input nodes for receiving an input signal Vin as the mixing signal $V_{RF}$, and gates of the FETs M20 and M30 are connected to each other and also connected in common to the other of the pair of input node nodes for receiving the input signal Vin. Drains of the FETs M10 and M30 are connected to each other so as to receive a drive current $I_{10}$ in common, and drains of the FETs M20 and M40 are connected to each other so as to receive receive a drive current $I_{20}$ in common.

Now, assuming that the four FETs M10 to M40 operate in a saturated regions, and also assuming that $L_1=L_2=L_3=L_4$, respective drain currents $I_{d10}$, $I_{d20}$, $I_{d30}$, and $I_{d30}$ of the four FETs M10 to M40 can be expressed as follows:

$$I_{d10}=\beta(V_{GS10}-V_t)^2 \quad (20)$$

$$I_{d20}=K\beta(V_{GS20}-V_t)^2 \quad (21)$$

$$I_{d30}=K\beta(V_{GS30}-V_t)^2 \quad (22)$$

$$I_{d40}=\beta(V_{GS40}-V_t)^2 \quad (23)$$

where $\beta$ is the transconductance parameter of the FET M10, and is expressed by $(\frac{1}{2})\mu \cdot C_{ox}(W/L)$ where $\mu$ is an effective mobility and $C_{ox}$ is a gate oxide film capacitance per unit area;

$V_{GS10}$, $V_{GS20}$, $V_{GS30}$ and $V_{GS40}$ a gate-source voltage of the FETs M10 to M40; and $V_t$ is the threshold voltage.

Therefore, the constant current source and the input voltage $V_{in}$ can be expressed as follows $$I_{d10}+I_{d20}=I_{d30}+I_{d40}=I_o \quad (24)$$

$$V_{GS10}-V_{GS20}=V_{GS40}-V_{GS30}=V_{LO} \quad (25)$$

If the above equations (20) to (25) are solved, the following equation can be obtained:

By differentiating the above equation (28) by the input voltage $V_{in}$, the transconductance can be obtained.

$$I_{d10} - I_{d20} = \begin{cases} \sqrt{\dfrac{-\left(1 - \dfrac{1}{K}\right)\left\{\left(1 + \dfrac{1}{K}\right)I_0 - 2\beta V_{in}^2\right\} + \beta V_{in}\left(\dfrac{4}{\sqrt{K}}\right)\sqrt{\left(1 + \dfrac{1}{K}\right)\dfrac{I_0}{\beta} - V_{in}^2}}{\left(1 + \dfrac{1}{K}\right)^2}} & \left(-\sqrt{\dfrac{I_0}{\beta}} \leqq V_{in} \leqq \sqrt{\dfrac{I_0}{(K\beta)}}\right) \\ I_0 \left(V_{in} \geqq \sqrt{\dfrac{I_0}{(K\beta)}}\right) \\ -I_0 \left(V_{in} \leqq -\sqrt{\dfrac{I_0}{\beta}}\right) \end{cases} \quad (26)$$

$$I_{d30} - I_{d40} = \begin{cases} \sqrt{\dfrac{\left(1 - \dfrac{1}{K}\right)\left\{\left(1 + \dfrac{1}{K}\right)I_0 - 2\beta V_{in}^2\right\} + \beta V_{in}\left(\dfrac{4}{\sqrt{K}}\right)\sqrt{\left(1 + \dfrac{1}{K}\right)\dfrac{I_0}{\beta} - V_{in}^2}}{\left(1 + \dfrac{1}{K}\right)^2}} & \left(-\sqrt{\dfrac{I_0}{(K\beta)}} \leqq V_{in} \leqq \sqrt{\dfrac{I_0}{\beta}}\right) \\ I_0 \left(V_{in} \geqq \sqrt{\dfrac{I_0}{\beta}}\right) \\ -I_0 \left(V_{in} \leqq -\sqrt{\dfrac{I_0}{(K\beta)}}\right) \end{cases} \quad (27)$$

Therefore, $$\Delta I_1 = (I_{d10} + I_{d30}) - (I_{d20} + I_{d40})$$
$$= (I_{d10} - I_{d20}) + (I_{d30} - I_{d40})$$

$$= \begin{cases} \dfrac{\left(\dfrac{8}{\sqrt{K}}\right)\beta V_{in}\sqrt{\left(1 + \dfrac{1}{K}\right)\dfrac{I_0}{\beta} - V_{in}^2}}{\left(1 + \dfrac{1}{K}\right)^2} & \left(|V_{in}| \leqq \sqrt{\dfrac{I_0}{(K\beta)}}\right) \\[2ex] \dfrac{\left(\dfrac{4}{\sqrt{K}}\right)\beta V_{in}\sqrt{\left(1 + \dfrac{1}{K}\right)\dfrac{I_0}{\beta} - V_{in}^2}}{\left(1 + \dfrac{1}{K}\right)^2} + \dfrac{2\left(1 - \dfrac{1}{K}\right)\beta V_{in}^2}{\left(1 + \dfrac{1}{K}\right)^2}\, \text{sgn}(V_{in}) \\[2ex] + \dfrac{2\left(\dfrac{1}{K}\right)}{1 + \dfrac{1}{K}} I_0\, \text{sgn}(V_{in}) & \left(\sqrt{\dfrac{I_0}{(K\beta)}} \leqq |V_{in}| \leqq \sqrt{\dfrac{I_0}{\beta}}\right) \\[2ex] 2I_0\, \text{sgn}(V_{in}) & \left(|V_{in}| \geqq \sqrt{\dfrac{I_0}{\beta}}\right) \end{cases} \quad (28)$$

$$\frac{d(\Delta I_1)}{dV_{in}} = \begin{cases} \frac{8K\sqrt{\beta I_0}}{(K+1)\sqrt{1+K}}\left[\sqrt{1-\frac{V_{in}^2}{\left(1+\frac{1}{K}\right)\left(\frac{I_0}{\beta}\right)}} - \frac{\frac{V_{in}^2}{\left\{\left(1+\frac{1}{K}\right)\left(\frac{I_0}{\beta}\right)\right\}}}{\sqrt{1+\frac{V_{in}^2}{\left\{\left(1+\frac{1}{K}\right)\left(\frac{I_0}{\beta}\right)\right\}}}}\right] & \left(|V_{in}| \leq \sqrt{\frac{I_0}{(K\beta)}}\right) \\[2em] \frac{4K\sqrt{\beta I_0}}{(K+1)\sqrt{1+K}}\left[\sqrt{1-\frac{V_{in}^2}{\left(1+\frac{1}{K}\right)\left(\frac{I_0}{\beta}\right)}} - \frac{\frac{V_{in}^2}{\left\{\left(1+\frac{1}{K}\right)\left(\frac{I_0}{\beta}\right)\right\}}}{\sqrt{1+\frac{V_{in}^2}{\left\{\left(1+\frac{1}{K}\right)\left(\frac{I_0}{\beta}\right)\right\}}}}\right] \\[1em] + \frac{4\left(1-\frac{1}{K}\right)\beta V_{in}}{\left(1+\frac{1}{K}\right)^2} & \left(\sqrt{\frac{I_0}{(K\beta)}} \leq |V_{in}| \leq \sqrt{\frac{I_0}{\beta}}\right) \\[1em] 0 & \left(|V_{in}| \geq \sqrt{\frac{I_0}{\beta}}\right) \end{cases} \quad (29)$$

In the above equation (29), putting K=9.5, the obtained transconductance can have a 15% equiripple of the maximum value, and therefore, the linearity can be improved to a maximum degree.

Figure 3:
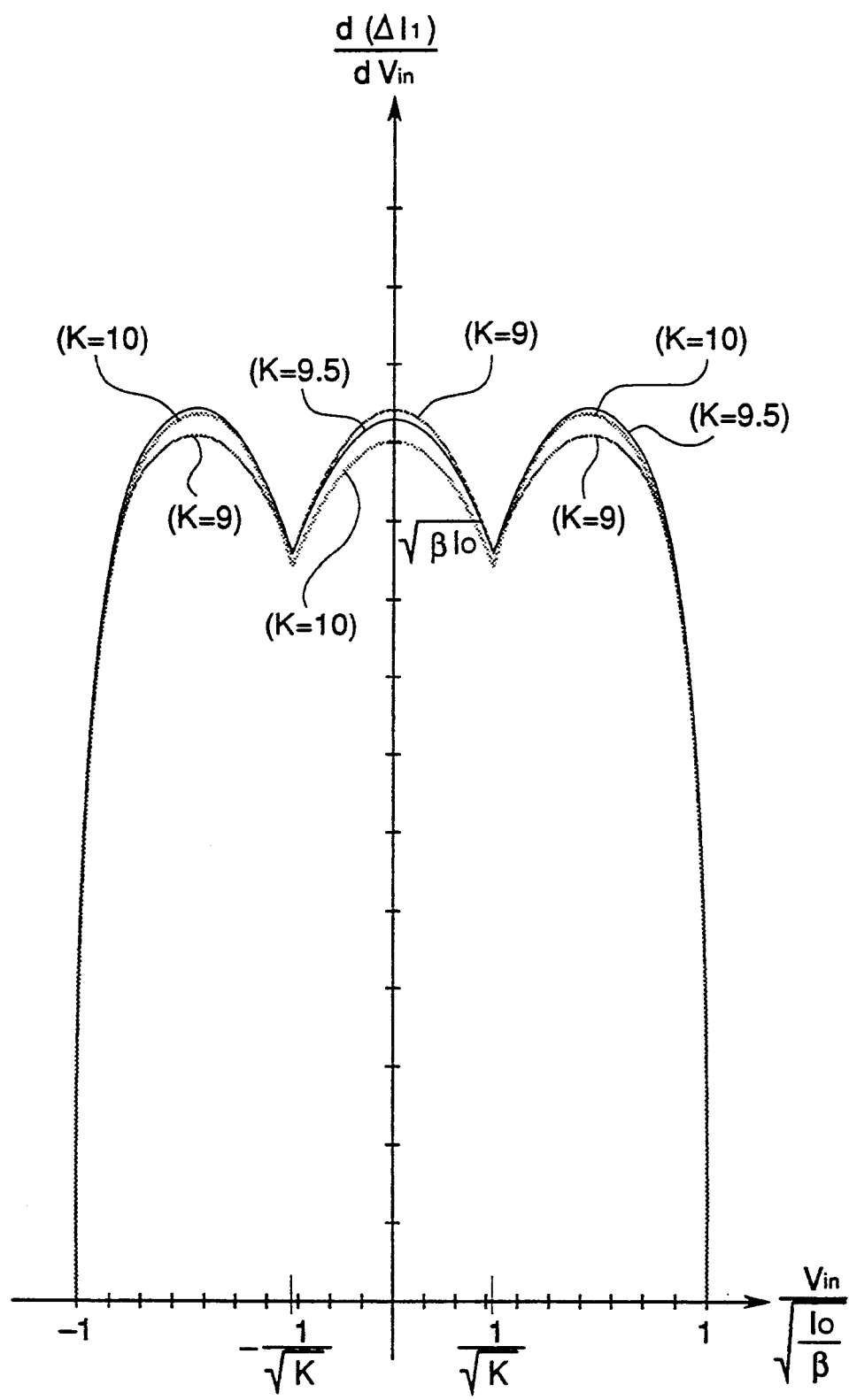
FIG. 3 is a graph showing a transconductance of the differential circuit shown in FIG. 2.

FIG. 3 is a graph showing a transconductance of the differential circuit shown in FIG. 2.

In addition, if the gate size can be reduced, the size of the FETs can be correspondingly reduced. Therefore, similarly to the conventional unbalanced differential circuit, if the gate length L is the same and the gate width is K times, gate areas $S_{G10}$ and $S_{G20}$ of the FETs M10 and M20 can be expressed $$S_G = S_{G10} + S_{G20} = L_{10}W_{10}(1+K) \quad (30)$$

In the embodiment shown in FIG. 2, it can be assumed as follows:

$$W_{10}/L_{10} = 1/\sqrt{K} \quad (31)$$

$$W_{20}/L_{20} = \sqrt{K} \quad (32)$$

Therefore, the gate areas $S_{G10}$ and $S_{G20}$ can be expressed as follows:

$$S_G = S_{G10} + S_{G20} = \sqrt{K}\, W_{10}^2 + \sqrt{K}\, L_{20}^2 \quad (33)$$

Here, assuming that respective minimum sizes of the gate length $L_{10}$ and the gate width $W_{10}$ are 3 μm, from the equation (30), $S_G = 94.5$ μm²

On the other hand, assuming $W_{10} = L_{20} = 3$ μm, from the equation (33), $S_G = 55.5$ μm²

Namely, the gate area can be reduced to 58.7%. This corresponds to K=5.2 in the conventional method in the gate length L is the same and the gate width is K times. Namely, the transistor size can be reduced in comparison with K=9.5 in the conventional method.

In addition, if the input signal is in the range of $|V_{in}| \leq 0.85 V\mu$ where $V\mu = (I_0/\beta)^{\frac{1}{2}}$, the transconductance is in the range of −15% from the maximum value, and therefore, a sufficient wide range having a relatively good linearity can be obtained. In conventional matching differential circuit, the transconductance drops to −30% in the range of $|V_{in}| \leq V\mu$. Accordingly, the linearity can be improved double by restricting the input range by 15%.

In general, the gate length L of the transistors has a relatively large variation of manufacturing. However, when the degree of unbalance is enlarged to K=9.5, even if the value of K varies to some extent, if the matching of the device can be ensured, the change of the characteristics is small. For example, the transconductance characteristics in the cases of K=9 and k=10 are added in FIG. 3.

As seem from the above, in the frequency multiplier and mixer circuit in accordance with the present invention, the first differential amplifier constituting the frequency multiplier is composed of a squaring circuit utilizing a squaring characteristics of the FETs, and therefore, a sufficient spurious characteristics can be obtained. Accordingly, the frequency multiplier can be connected to the second differential amplifier constituting the mixer, through the current mirror circuits, but with no filter between the frequency multiplier and the mixer. In addition, external terminals for the frequency multiplier become unnecessary. Therefore, the frequency multiplier and mixer circuit in accordance with the present invention is very suitable to be implemented in the semiconductor integrated circuit.

The invention has thus been shown and described with reference to the specific embodiments. However, it should be noted that the present invention is in no way limited m the details of the illustrated structures but changes and modifications may be made within the scope of the appended claims.

I claim:

1. A frequency multiplier and mixer circuit comprising:

a first pair of input terminals for receiving a signal to be frequency-multiplied;

a second pair of input terminals for receiving a mixing signal;

an output terminal for outputting an output signal;

a frequency multiplier circuit composed of a first differential amplifier, which includes first and second differential circuits, said first differential circuit being formed of source-coupled first and second field effect transistors having their respective driving powers in a ratio of K:1 where K is a positive real number excluding 1, and said second differential circuit being formed of source-coupled third and fourth field effect transistors having their respective driving powers in a ratio of 1:K, sources of said first and second field effect transistors being connected in common to a first constant current source, and sources of said third and fourth field effect transistors being connected in common to a second constant current source, gates of said first and third field effect transistors having different driving powers being connected in common to one terminal of said first pair of input terminals, and gates of said second and fourth field effect transistors having different driving powers being connected in common to the other terminal of said first pair of input terminals, drains of said first and fourth field effect transistors having the same driving power being connected to a first node of a pair of output nodes, and drains of said second and third field effect transistors having the same driving power being connected to a second node of said pair of output nodes;

a current mirror means having an input current path connected to said first node of said pair of output nodes so as to flow a differential current between said pair of output nodes, and a mirror current path; and a mixing circuit composed of a second differential amplifier, which includes a pair of inputs connected to said second pair of input terminals, one end of one main current path of two main current paths of said second differential amplifier being connected to said output terminal, the other end of each of said two main current paths being connected in common to said mirror current path of said current mirror means.

2. A frequency multiplier and mixer circuit claimed in claim 1 further including a first current mirror circuit having an input current path and a mirror current path which are respectively connected between a supply voltage and said first node of said pair of output nodes and between said supply voltage and said second node of said pair of output nodes, and wherein said current mirror means includes a second current mirror circuit having an input current path connected between said supply voltage and said second node of said pair of output nodes and a mirror current path connected at its one end to said supply voltage, and a third current mirror circuit having an input current path connected in series with said mirror current path of said second current mirror circuit, a mirror current path of said third current mirror circuit being connected to the other end of each of said two main current paths of said second differential amplifier.

3. A frequency multiplier and mixer circuit claimed in claim 2 wherein said second differential amplifier includes a pair of emitter-coupled bipolar transistors having their respective bases connected to said second pair of input terminals, respectively, emitters of the pair of bipolar transistors being connected in series to said mirror current path of said third current mirror circuit, and a collector of one of said bipolar transistors is connected to said output terminal.

4. A frequency multiplier and mixer circuit claimed in claim 2 wherein said third current mirror circuit having first and second mirror current paths of the same current capacity, and wherein said second differential amplifier includes a first differential circuit formed of source-coupled fifth and sixth field effect transistors having their sources connected in common to said first mirror current path of said third current mirror circuit, and a second differential circuit formed of source-coupled seventh and eighth field effect transistors having their sources connected in common to said second mirror current path of said third current mirror circuit, a ratio of a gate width-to-length ratio of said fifth field effect transistor to a gate width-to-length ratio of said sixth field effect transistor being 1:9.5, and a ratio of a gate width-to-length ratio of said seventh field effect transistor to a gate width-to-length ratio of said eighth field effect transistor being 9.5:1, gates of said fifth and eighth field effect transistors being connected in common to one input of said second pair of input terminals, and gates of said sixth and seventh field effect transistors being connected in common to the other input of said second pair of input terminals, drains of said fifth and seventh field effect transistors being connected to each other, and drains of said sixth and eighth field effect transistors being connected to each other.

5. A frequency multiplier and mixer circuit claimed in claim 1 wherein said first and second constant current sources have the same current capacity, and the driving power of said first and fourth field effect transistors is larger than that of said second and third field effect transistors.

* * * * *